United States Patent
Forbes (10) Patent No.: US 6,249,191 B1
(45) Date of Patent: *Jun. 19, 2001

(54) MONOLITHIC INTEGRATED CIRCUIT OSCILLATORS, COMPLEMENTARY METAL OXIDE SEMICONDUCTOR (CMOS) VOLTAGE-CONTROLLED OSCILLATORS, INTEGRATED CIRCUIT OSCILLATORS, OSCILLATOR-FORMING METHODS, AND OSCILLATION METHODS

(75) Inventor: Leonard Forbes, Corvallis, OR (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,019

(22) Filed: Nov. 23, 1998

(51) Int. Cl.⁷ .................................................. H03B 5/00
(52) U.S. Cl. ............................... 331/117 FE; 331/117 D; 331/117 R; 331/167
(58) Field of Search ............... 331/107 SL, 107 DP, 331/117 D, 117 FE, 96, 117 V, 117 R, 167

(56) References Cited

U.S. PATENT DOCUMENTS

| | | | |
|---|---|---|---|
| 4,135,168 | 1/1979 | Wade | 331/108 |
| 5,138,285 | 8/1992 | Michels | 331/116 |
| 5,175,513 | 12/1992 | Hara | 331/115 |
| 5,436,523 | * 7/1995 | Staudte | 310/348 |

(List continued on next page.)

OTHER PUBLICATIONS

Hitko, Donald A. et al., "A IV, 5mW, 1.8 GHz, Balanced Voltage–Controlled Oscillator with an Integrated Resonator", Microsystems Technology Laboratories and Analog Devices, Inc., 1997, pp. 46–51.

Hara, S. et al., "Monolithic Microwave Active Inductors and Their Applications", IEEE International Symposium on Circuits and Systems, Cat. No. 91CH3006–4), Abstract.

Lucyszn, S., et al., "0.1 THz Rectangular Waveguid on GaAs Semi–Insulating Substrate".

(List continued on next page.)

*Primary Examiner*—Robert Pascal
*Assistant Examiner*—Kimberly E Glenn
(74) *Attorney, Agent, or Firm*—Wells, St. John, Roberts, Gregory & Matkin P.S.

(57) ABSTRACT

Monolithic integrated circuit oscillators, complementary metal oxide semiconductor (CMOS) voltage-controlled oscillators, integrated circuit oscillators, oscillator-forming methods, and oscillation methods are described. In one embodiment, a monolithic integrated circuit oscillator is provided and includes a semiconductive substrate. A field effect transistor is supported by the semiconductive substrate and an oscillator circuit is connected therewith. The oscillator circuit preferably comprises an inductor which is supported by the substrate and has an inductance value greater than or equal to about 4 nH. In another embodiment, a complementary metal oxide semiconductor (CMOS) voltage-controlled oscillator is provided and includes a metal oxide semiconductor field effect transistor (MOSFET) received by and supported over a silicon-containing substrate. The transistor has a gate, a source, and a drain. A first inductor is received within an insulative material layer supported by the substrate and is connected with the gate. A second inductor is received within the insulative material layer and is connected with the source. A capacitor is operably connected with the first inductor, wherein at least one of the inductors has an inductance value greater than or equal to about 4 nH. Other embodiments are described.

44 Claims, 6 Drawing Sheets

U.S. PATENT DOCUMENTS

| | | | |
|---|---|---|---|
| 5,539,241 | * | 7/1996 | Abidi et al. .......................... 257/531 |
| 5,610,433 | * | 3/1997 | Merrill et al. ....................... 257/537 |
| 5,726,613 | | 3/1998 | Hayashi et al. ...................... 333/214 |
| 5,736,913 | | 4/1998 | Sanyigo et al. ...................... 333/246 |
| 5,973,575 | * | 10/1999 | Kamogawa et al. ............. 331/117 R |

OTHER PUBLICATIONS

N. Hayashi et al., "A Novel Broad–Band MMIC VCO Using an Active Inductor", IEICE Trans. on Fundamentals of Electronics, Communications and Computer Sciences. vol. E81–A, No. 2, p. 224–9, Feb. 1998.

Burns, Lawrence M., "Applications for GaAs and Silicon Integrated Circuits in Next Generation Wireless Communication Systems", IEEE Journal of Solid–State Circuits, vol. 30, No. 10, Oct. 1995, pp. 1088–1095.

Craninckx, Jan, et al., "A 1.8–GHz Low–Phase–Noise Spiral–LC CMOS VCO", Symposium or VLSI Circuits Digest of Technical Papers, 1996, pp. 30, 31.

Nguyen, N.M., et al., "Si IC Compatible Inductors and LC Passive Filters", IEEE Journal of Solid–State Circuits, Abstract.

Chang, J. Y. C., et al., "Large Suspended Inductors on Silicon and Their Use in a 2–$\mu$m CMOS RF Amplifier", IEEE Electron Device Letters, vol. 14, No. 5, May 1993, p. 246–248.

Burghartz, N.J., et al., "Multilevel–Spiral Inductors Using VLSI Interconnect Technology", IEEE Electron Devide Letters, Abstract.

Burghartz, Joachim N. et al., "Integrated RF and Microwave Components in BiCMOS Technology", IEEE Transactions on Electron Devices, vol. 43, No. 9, Sep. 1996, pp. 1559–1570.

*The New IEEE Standard Dictionary of Electrical and Electronics Terms—5$^{th}$ Ed.*, ©1993, pp. 896 and 1134–1135.

*Solid State Electronic Devices—Solid State Physical Electronics Series*, Ben G. Streetman, ©1972, pp. 293–294 and 376.

* cited by examiner

MONOLITHIC INTEGRATED CIRCUIT OSCILLATORS, COMPLEMENTARY METAL OXIDE SEMICONDUCTOR (CMOS) VOLTAGE-CONTROLLED OSCILLATORS, INTEGRATED CIRCUIT OSCILLATORS, OSCILLATOR-FORMING METHODS, AND OSCILLATION METHODS

TECHNICAL FIELD

This invention pertains to monolithic integrated circuit oscillators, to complementary metal oxide semiconductor (CMOS) voltage-controlled oscillators, to integrated circuit oscillators, to oscillator-forming methods, and to oscillation methods.

BACKGROUND OF THE INVENTION

As integrated circuit devices continue to shrink in size, the demand to integrate different functionalities on the same integrated circuit die also continues to grow. For example, portable wireless communication products have become high volume consumer devices. Some of these devices are now operating in the 1–2 GHz frequency range. There is, as a consequence, a demand to integrate RF front end circuits into high-yield silicon integrated circuit processes to allow a combination of analog, digital, and RF functions on the same integrated circuit die. Yet, considerable difficulty has been experienced in attempts to fabricate inductors having high quality factors (Q) in silicon technology for RF circuits which are used in communications.

Basic single transistor RF oscillator configurations such as Colpitts, Hartley, and Clapp configurations using FETs are known in hybrid electronics technology and are typically implemented using discrete components along with integrated circuit FETs. Examples are described in U.S. Pat. No. 5,138,285, the disclosure of which is incorporated by reference. In gallium arsenide monolithic microwave integrated circuits (MMICs), where all of the components are integrated on the same semiconductor substrate, advantages can be attained in that both the FETs and the inductors can be fabricated on the same semi-insulating substrate which results in minimal parasitic losses and high quality factor (Q) spiral inductors.

Voltage controlled oscillators or VCO's, have been reported in CMOS integrated circuit technology using spiral inductors, but, because of the difficulty in fabricating spiral inductors, the inductors have relatively small values, e.g. 3.2 nH, and large capacitors, e.g. 2.44 pF, are required to form a desired oscillator. With component values such as these, wafer real estate demands can be prohibitive. This can, as a result, cause inconsistencies in integration with other CMOS analog and digital circuits.

Attempts have been made to build high-Q inductors in silicon integrated circuit technology, but have yielded Q factors of only three to eight. This is undesirable in the context of RF circuit design at frequencies in the above-stated range, where required Q factors need to be typically in a range from between 5–20 for broad-band applications, and may have to be higher than 30 in narrow-band networks. Problems associated with the use of silicon technology in these scenarios, in part, result from the conductivity of silicon substrates which tends to induce losses. As frequencies approach the self resonant frequency, the inductance value decreases which is most undesirable. Losses in the conductive silicon substrates can be increased by the high dielectric constant of the insulators under the conductors and the relatively large values of stray capacitance coupling to the silicon substrate.

Some attempts have been made to provide oxide-encased, spiral-type inductors for silicon technology, with such encased inductors being disposed over a cavity which is etched into the silicon substrate. Others have attempted to provide higher-Q inductors in a five or six-level metal BiCMOS technology. The conductors in these instances are still encased in oxide but are far removed from the silicon substrate by virtue of a large number of insulator and metal levels. The number of these levels, however, is far in excess of the two to four levels commonly utilized in CMOS technology.

Other attempts have been made to provide higher-Q inductors through the use of long pad-to-pad wire bond techniques in BiCMOS technology in the design and fabrication of voltage controlled oscillators. Wire bond inductors have previously been used in a variety of applications as inductors and for impedance matching networks and, more recently, to create low impedance resonant connections from guard rings or bonding pads to ground planes. Having the conductor surrounded by air rather than an insulator serves to reduce losses from the conductive silicon substrates and yield high-Q values (11 to 15 at 1.8 GHz). However, having such long unsupported spans of wire, e.g. up to three millimeters in some cases, does not provide for good mechanical stability. In addition, there is no provision nor is there a possibility of passivation in these structures. Air bridge or wire bond inductors might have very good high-Q values, but their characteristics typically tend to be subject to change in the event of severe mechanical shocks or abrasion. In addition, such structures are not suitably protected from corrosive environments.

Against the backdrop of these attempts, there continues to remain a need in silicon integrated circuit technologies for high-Q inductors with rigid and fixed mechanical characteristics. Such inductors can be used in the design and implementation of oscillators, tuned amplifiers, and in optimizing broad band amplifiers. These cannot be achieved by standard integrated circuit techniques, nor air bridge and/or suspended metal conductors.

Accordingly, this invention arose out of concerns associated with providing improved oscillators and methods of forming the same. This invention also arose out of concerns associated with providing improved monolithic oscillators capable of functional performance at the above-stated frequencies.

SUMMARY OF INVENTION

Monolithic integrated circuit oscillators, complementary metal oxide semiconductor (CMOS) voltage-controlled oscillators, integrated circuit oscillators, oscillator-forming methods, and oscillation methods are described. In one embodiment, a monolithic integrated circuit oscillator is provided and includes a semiconductive substrate. A field effect transistor is supported by the semiconductive substrate and an oscillator circuit is connected therewith. The oscillator circuit preferably comprises an inductor which is supported by the substrate and has an inductance value greater than or equal to about 4 nH. In another embodiment, a complementary metal oxide semiconductor (CMOS) voltage-controlled oscillator is provided and includes a metal oxide semiconductor field effect transistor (MOSFET) received by and supported over a silicon-containing substrate. The transistor has a gate, a source, and a drain. A first inductor is received within an insulative material layer supported by the substrate and is connected with the gate. A second inductor is received within the insulative material layer and is connected with the source. A capacitor is operably connected with the first inductor, wherein at least one of the inductors has an inductance value greater than or equal to about 4 nH. Other embodiments are described.

BRIEF DESCRIPTION OF THE DRAWINGS

Preferred embodiments of the invention are described below with reference to the following accompanying drawings.

FIG. 3 is a graph which is useful in understanding the operation of one or more embodiments of the invention.

FIG. 4 is a graph which is useful in understanding the operation of one or more embodiments of the invention.

DETAILED DESCRIPTION OF THE PREFERRED EMBODIMENTS

This disclosure of the invention is submitted in furtherance of the constitutional purposes of the U.S. Patent Laws "to promote the 4 progress of science and useful arts" (Article 1, Section 8).

Figure 1:
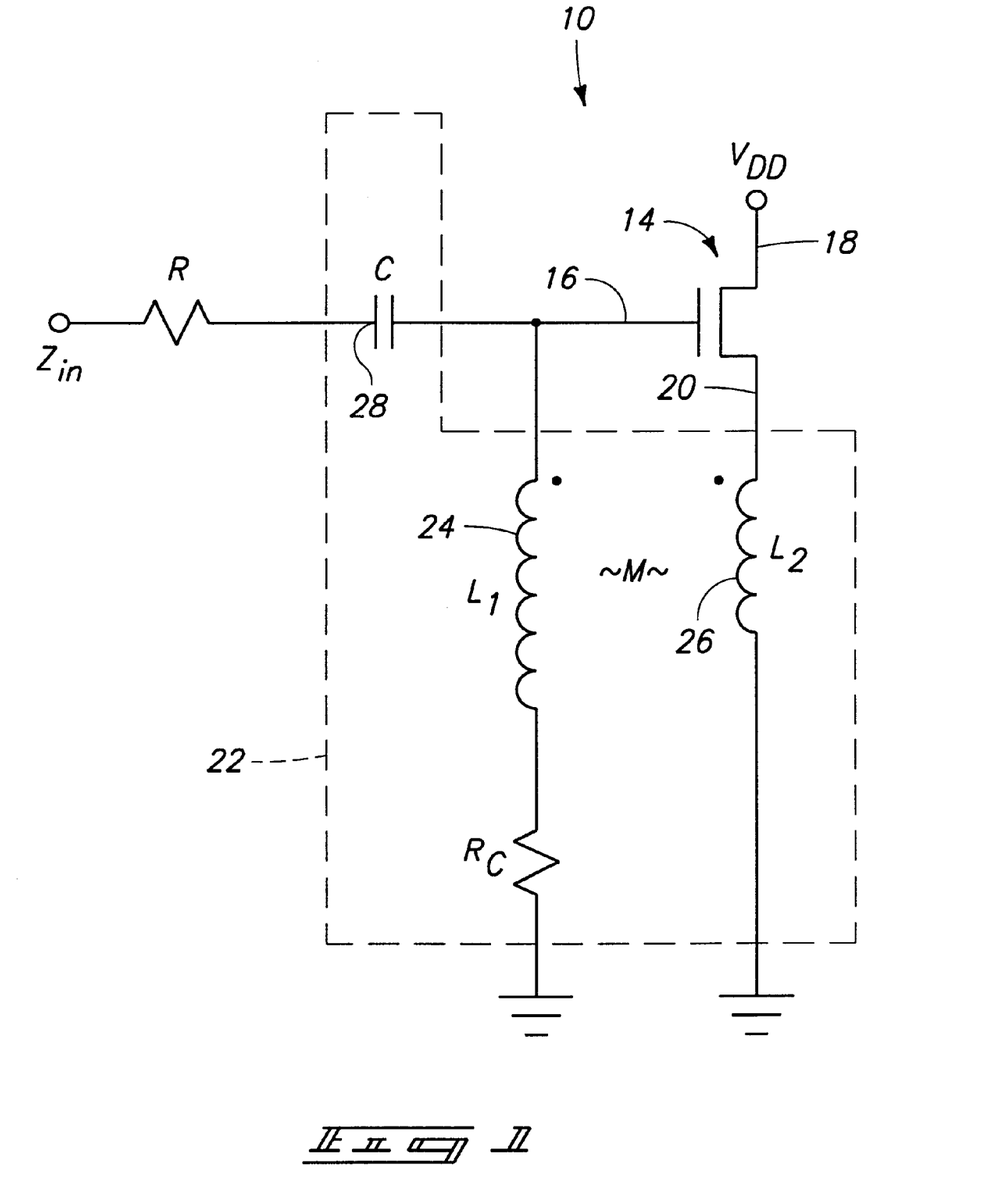
FIG. 1 is a schematic circuit diagram of a circuit in accordance with one embodiment of the invention.
Figure 7:
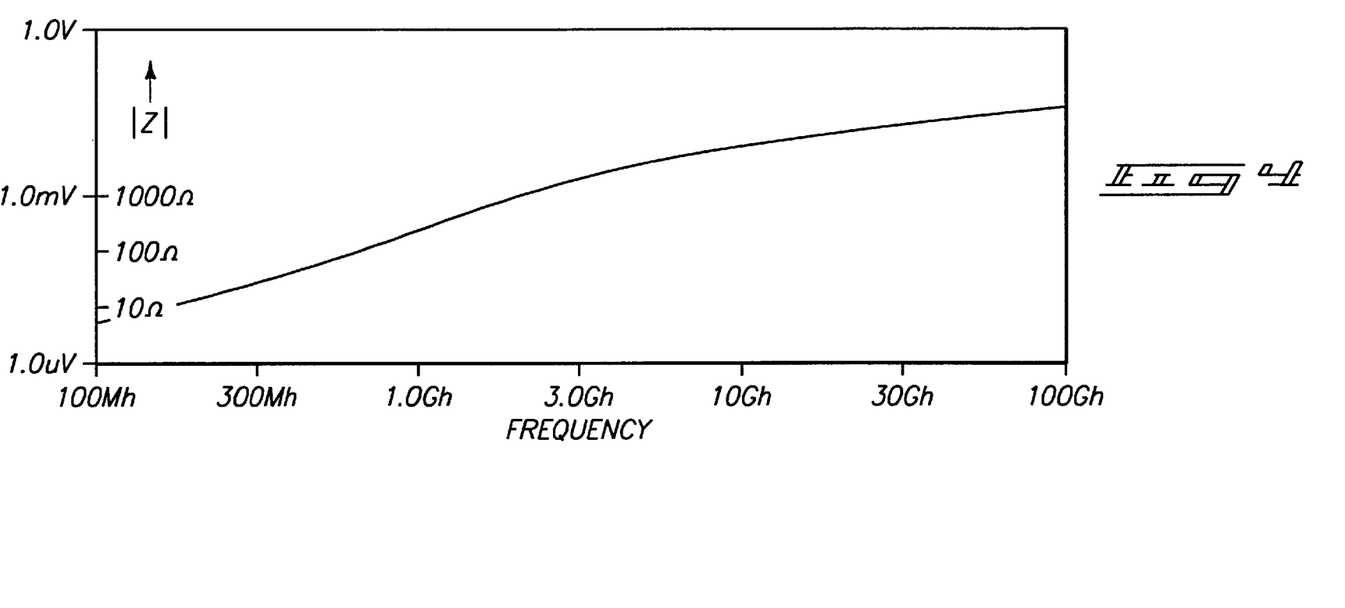
FIG. 7 is a diagrammatic side sectional view of one aspect of one embodiment of the present invention.
Figure 8:
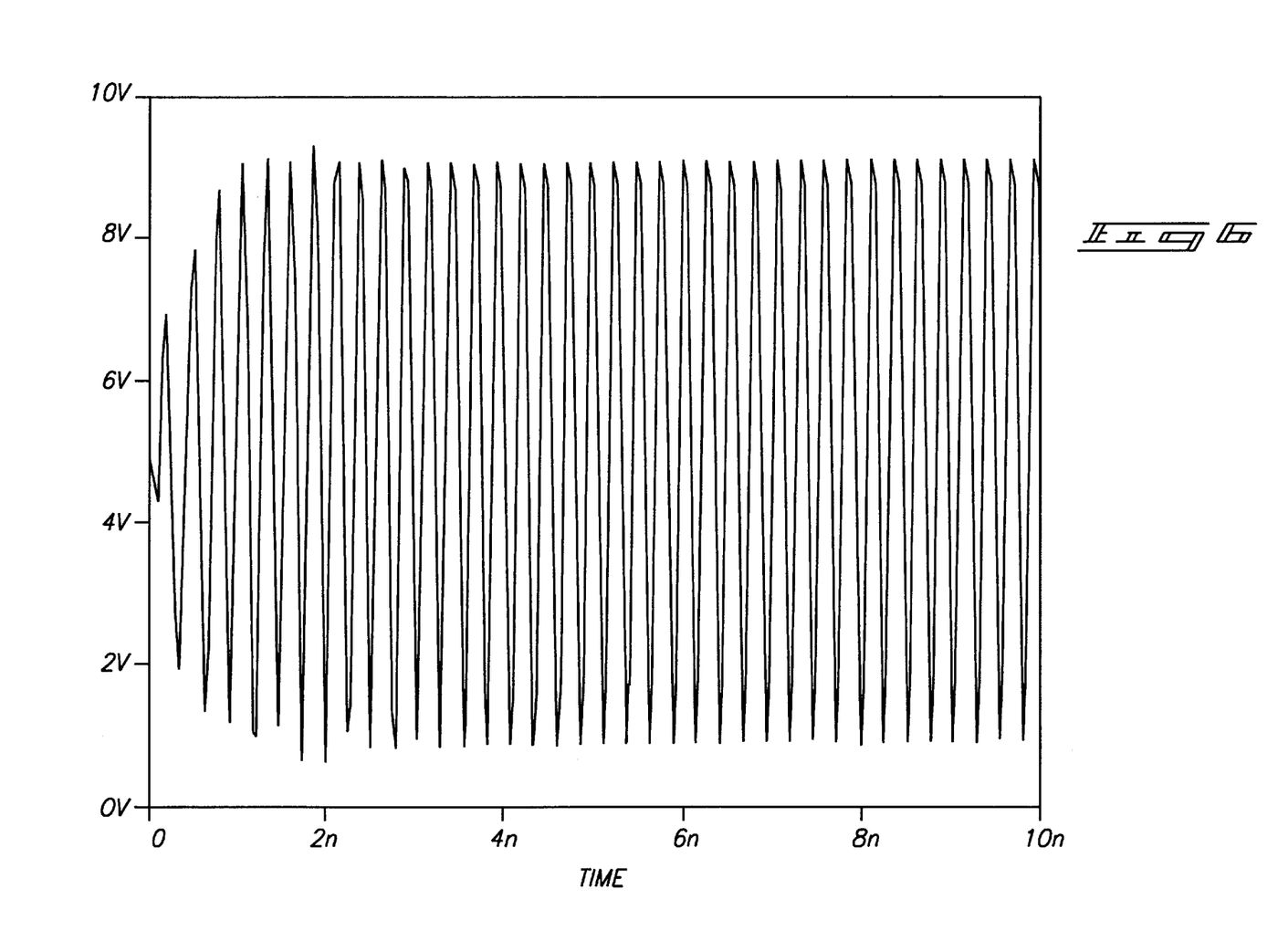
FIG. 8 is a diagrammatic side sectional view of one aspect of one embodiment of the present invention.

Referring to FIGS. 1, 7, and 8, and in accordance with one embodiment of the invention, a monolithic integrated circuit oscillator is provided generally at 10 (FIG. 1) and includes a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A field effect transistor 14 is provided and is supported by substrate 12. Transistor 14 includes a gate 16, a drain 18, and a source 20. An oscillator circuit 22 is connected with field effect transistor 14 and comprises first and second inductors 24, 26 respectively, which are supported by semiconductive substrate 12. Preferably one, and even more preferably both inductors have inductance values greater than or equal to about 4 nH. In one embodiment, oscillator circuit 22 comprises a capacitor 28 which is operably connected with inductor 24 and gate 16. In a preferred embodiment, inductor 24 comprises a spiral-type inductor and has an inductance value greater than or equal to about 9 nH. In another preferred embodiment, second inductor 26 is a spiral-type inductor and has an inductance value greater than or equal to about 4 nH. In a most preferred embodiment, both of inductors 24 and 26 are spiral-type inductors, as is shown in cross-sectional view in FIG. 8. In the illustrated example, inductor 24 is connected with gate 16 and inductor 26 is connected with source 20. A resistor $R_c$ is provided and, in this example, constitutes the inherent resistance of inductor 24.

In another embodiment, oscillator 10 comprises a complementary metal oxide semiconductor (CMOS) voltage-controlled oscillator (VCO). Transistor 14 comprises a metal oxide semiconductor field effect transistor (MOSFET) which is received by and supported over a silicon-containing substrate 12. A first inductor 24 is received within an insulative material layer 30 (FIG. 8) which is supported by substrate 12. The first inductor is preferably connected with gate 16. A second inductor 26 is received within insulative material layer 30 and is connected with source 20. A capacitor 28 is operably connected with first inductor 24, wherein at least one of the inductors has an inductance value greater than or equal to about 4 nH. In one CMOS embodiment, one of the first and second inductors 24, 26 comprises a spiral-type inductor. In another CMOS embodiment, both inductors 24, 26 comprise spiral-type inductors. In a preferred embodiment, substrate 12 comprises a bulk monocrystalline substrate. In one spiral-type inductor embodiment, and one which is shown best in FIG. 8, one of inductors 24, 26 is received over the other of inductors 24, 26. In the specific illustrated example, inductor 24 is received over inductor 26. Preferably, both the first and second inductors 24, 26 have inductance values which are greater than or equal to about 4 nH and the oscillator is configured to oscillate at a frequency around 3 GHz, which is described in more detail below. Preferably, one or more of the embodiments described above and below can comprise a monolithic CMOS voltage-controlled oscillator.

In another embodiment, integrated circuit oscillator 10 comprises a bulk monocrystalline silicon substrate 12. Field effect transistor 14 is supported by substrate 12 and comprises a gate 16, a drain 18, and a source 20. A first spiral-type inductor 24 is received within an insulative layer 30 over substrate 12 and is operably connected with gate 16. A second spiral-type inductor 26 is received within insulative layer 30 and is operably connected with source 20. A capacitor 28 is operably connected with field effect transistor 14 and has a value no greater than about 0.1 pF. Numerous capacitor constructions can be employed to supply the desired capacitance to form the oscillating circuit. For example, capacitor 28 can comprise a voltage-variable capacitor, the junction capacitance of a field effect transistor, or the gate capacitance of a field effect transistor, to name just a few. Other capacitor constructions will be apparent to those of skill in the art. In a preferred embodiment, the integrated circuit oscillator is configured to oscillate at a frequency of around 3 GHz. Preferably, oscillator circuit 10 is monolithic, with the field effect transistor, first and second spiral-type inductors, and capacitor being formed on a single die.

Referring still to FIGS. 1, 7, and 8, and in accordance with another embodiment, integrated circuit oscillator 10 includes a silicon-containing substrate 12. A metal oxide semiconductor field effect transistor (MOSFET) 14 is supported by substrate 12. An inductor assembly is supported by substrate 12 and is operably connected with field effect transistor 14. The inductor assembly preferably comprises no more than from between two to four conductive material levels over the substrate. An exemplary construction is shown in FIG. 8 where inductor 24 is seen to occupy one conductive material level and inductor 26 is seen to occupy another conductive material level. Accordingly, the two inductors occupy only two conductive material levels. Electrical interconnects are provided and extend to the left and right as viewed in the figure. These interconnects can, but need not occupy two additional conductive material levels which are utilized to interconnect the inductor assembly with field effect transistor 14 shown in FIG. 7.

A capacitor 28 (FIG. 1) is operably connected with field effect transistor 14 and the inductor assembly, and together therewith provides a circuit which is capable of resonating at frequencies greater than 1 GHz. In the illustrated and preferred embodiment, the inductor assembly comprises two inductors. These two inductors, examples of which are shown at 24 and 26, can comprise the only two inductors which make up the inductor assembly. Even more preferably, the inductor assembly comprises two spiral-type inductors. In the illustrated and preferred embodiment, integrated circuit oscillator 10 is monolithic, with MOSFET 14, the inductor assembly, and the capacitor being formed on the same die.

In another embodiment, an oscillator is formed by providing a silicon-containing substrate such as substrate 12. A field effect transistor 14 is formed over the substrate and has a gate 16, a drain 18, and a source 20. A first inductor 24 is formed and is operably connected with gate 16. A second inductor 26 is formed and is operably coupled with source 20. The inductors are preferably formed through integrated circuit techniques which can include, for example, damascene methods or subtractive methods. In damascene methods, trenches are formed in an insulative material in the pattern of a particular portion of an inductive element. Conductive material, e.g. aluminum, copper, or some other suitable material such as other metals, is subsequently deposited into the trenches, with unneeded metal being subsequently removed. In subtractive methods, a metal layer is formed over a substrate and subsequently patterned into a desired inductive element shape.

A capacitor 28 is coupled with first inductor 24 sufficiently to form an oscillation circuit which is capable of oscillating at a frequency around 3 GHz, and which preferably has a quality factor Q greater than about 10. In a preferred embodiment, the coupling of capacitor 28 comprises forming the capacitor over the substrate. In another preferred embodiment, the forming of the first and second inductors comprises forming one of the inductors, and even more preferably, both of the inductors to be spiral-type inductors.

An oscillation method in accordance with the present invention comprises providing a bulk monocrystalline silicon substrate having formed thereon circuitry which is capable of oscillating at a frequency of around 3 GHz. The circuitry preferably comprises a field effect transistor 14 having a gate 16 and a source 20. A pair of inductors, e.g. inductors 24, 26, are operably connected with the gate and source, respectively, of field effect transistor 14. A capacitor 28 is operably coupled with inductors 24, 26. The circuitry can then be oscillated at a frequency of around 3 GHz. In one embodiment, provision of the bulk monocrystalline silicon substrate having circuitry formed thereon comprises forming at least a portion of the circuitry over the substrate. Preferably one, and even more preferably both of the inductors are formed as spiral-type inductors (FIG. 8). The inductors can be provided to have inductance values greater than or equal to about 4 nH, and a capacitor can be provided having a capacitance value of less than or equal to about 0.1 pF. In a preferred embodiment, the inductors are formed to have inductance values greater than or equal to about 4 nH, and capacitor 28 is formed to have a capacitance value of less than or equal to about 0.1 pF. In another embodiment, provision of the substrate having the circuitry thereon comprises forming at least some of the circuitry over the substrate.

As discussed above, one of the advantages of the various embodiments of the present invention is that various circuits which utilize the inventive concepts can be realized through or in connection with CMOS fabrication techniques. Given the difficulty in fabricating inductors in CMOS integrated circuits, as opposed to, for example, GaAs MESFET circuits, the present invention provides solutions relating to the need for techniques to produce high inductance and high-Q elements in CMOS integrated circuits.

In accordance with some embodiments of the invention, an active inductor circuit utilizes a MOSFET to achieve a multiplication of inductance values and a multiplication of Q values by compensating for losses in the spiral inductors fabricated over conductive silicon substrates. Various circuit embodiments also generate a negative resistance which can be connected with a capacitor to form an oscillator. The circuit shown in FIG. 1 illustrates but one example of a MOSFET which is employed to achieve these objectives.

For purposes of a better understanding of the invention, the example circuit of FIG. 1 is compared to a simple passive L-R-C circuit. In one example, the active circuit of FIG. 1 utilizes an inductor $L_1$ which has an inductance value of 9 nH and a resistance of 100 ohms. Such provides a low-valued and high loss inductor. On the other hand, the passive circuit equivalent requires a larger inductor, e.g. 46 nH, to achieve the same resonant frequency near 3 GHz and, likewise, has a larger coil resistance, e.g. around 600 ohms. And, while the passive circuit equivalent can resonate near 3 GHz, its Q value is equal to around 1.5, rather than a desirable Q value of around 15. Clearly, the active circuit which employs the MOSFET has a smaller inductor area thereby taking up much less wafer area and, at the same time, providing a high quality factor Q which is suitable for use in the frequency range mentioned above.

Figure 2:
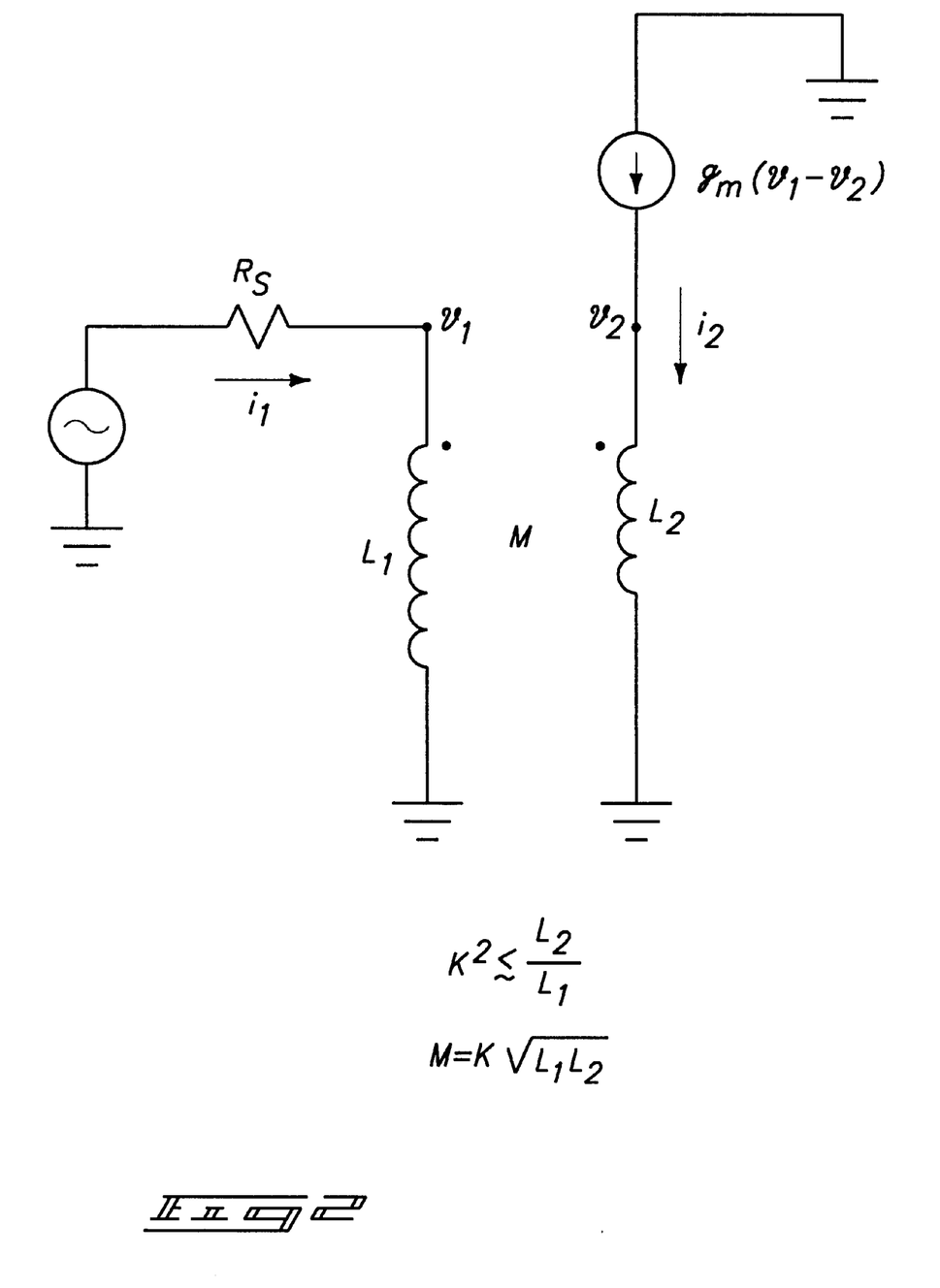
FIG. 2 is a schematic circuit diagram which is used in connection with certain derivations to assist in understanding the invention.

The design of the active circuit shown in FIG. 1, even without any coil resistance to represent the losses in coil, is seemingly simple, but in reality is rather complicated. This circuit is, in reality, a positive feedback circuit with a loop gain which is less than the order of 1, if $k^2 < L_2/L_1$, and since the amplifier is a source follower with a gain of one or less. The parameter k, just referenced, is the coupling coefficient between the two coils, where the mutual inductance $M=k(L_2 \cdot L_1)^{1/2}$. The equation derived just below results from the solution of the circuit node equations, in the simple case, where there is no coil resistance. Such a circuit is shown in FIG. 2.

$$V_1 = i_1(sL_1) + i_2(sM)$$
$$V_2 = i_1(sM) + i_2(sL_2)$$

where $$i_2 = g_m(V_1 - V_2)$$

$$Z = \frac{V_1}{i_1} = \frac{sL_1(1 + g_m sL_2 - g_m sk^2 L_2)}{(1 + g_m sL_2 - g_m sM)}$$

In the above equations, $s=j\omega$. Quite surprisingly, not only does this result in an effective multiplication of the impedance $Z=V_1/i_1$, or effective multiplication of the inductance, resulting in an impedance of around 1000 ohms (40 nH) at 3 GHz, rather than just the 9 nH (170 ohms) at 3 GHz, but also a negative impedance since the phase angle is larger than 90° as shown in FIG. 3. If there is no other positive resistance in the circuit, such as a coil resistance, or an added resistance, this circuit is potentially unstable and can be used in an oscillator.

A more detailed analytical investigation has been made of the circuit in FIG. 1, not including any coil resistance and additional stray resistance or resistance which might be added to the circuit. Impedance looking into the circuit is given by the equation set forth immediately below:

$$\frac{V_1}{i_1} = \frac{\omega^2 g_m L_1[(L_2-M)-L_2(1-k^2)]}{1+(\omega g_m(L_2-M))^2} +$$

$$sL_1 \frac{1+\omega^2 g_m^2 L_2(L_2-M)(1-k^2)}{1+(\omega g_m(L_2-M))^2}$$

This equation can be simplified if it is assumed that $(\omega)$ $g_m (L_2-M))^2 >> 1$.

With the above assumptions, the equation for input impedance becomes:

$$Z = \frac{V_1}{i_1} = \frac{[L_2(1-k^2)-(L_2-M)]}{g_m(L_2-M)} + sL_1 \frac{L_2(L_2-M)(1-k^2)}{(L_2-M)^2}$$

The effective inductance, $L_{eff}$ is then the multiplied inductance $L_{eff}=M_1L_1$, where $M_1$ is given by the equation:

$$M_1L_2=L_2(1-k^2)/(L_2-M)^2$$

The above equations describe conditions for multiplication of the inductance and oscillation. A first condition relates to the well known Nyquist criteria for feedback circuits. This circuit is in reality, a positive feedback circuit, but can be and will be stable if the loop gain is less than 1. Since the amplifier, the source follower, has at most a gain of 1, then this condition can be ensured by making the gain of the feedback loop, i.e. the transformer, have a gain less than 1 by making:

$k^2 - L_2/L_1$ or 0.6667

Figure 5:
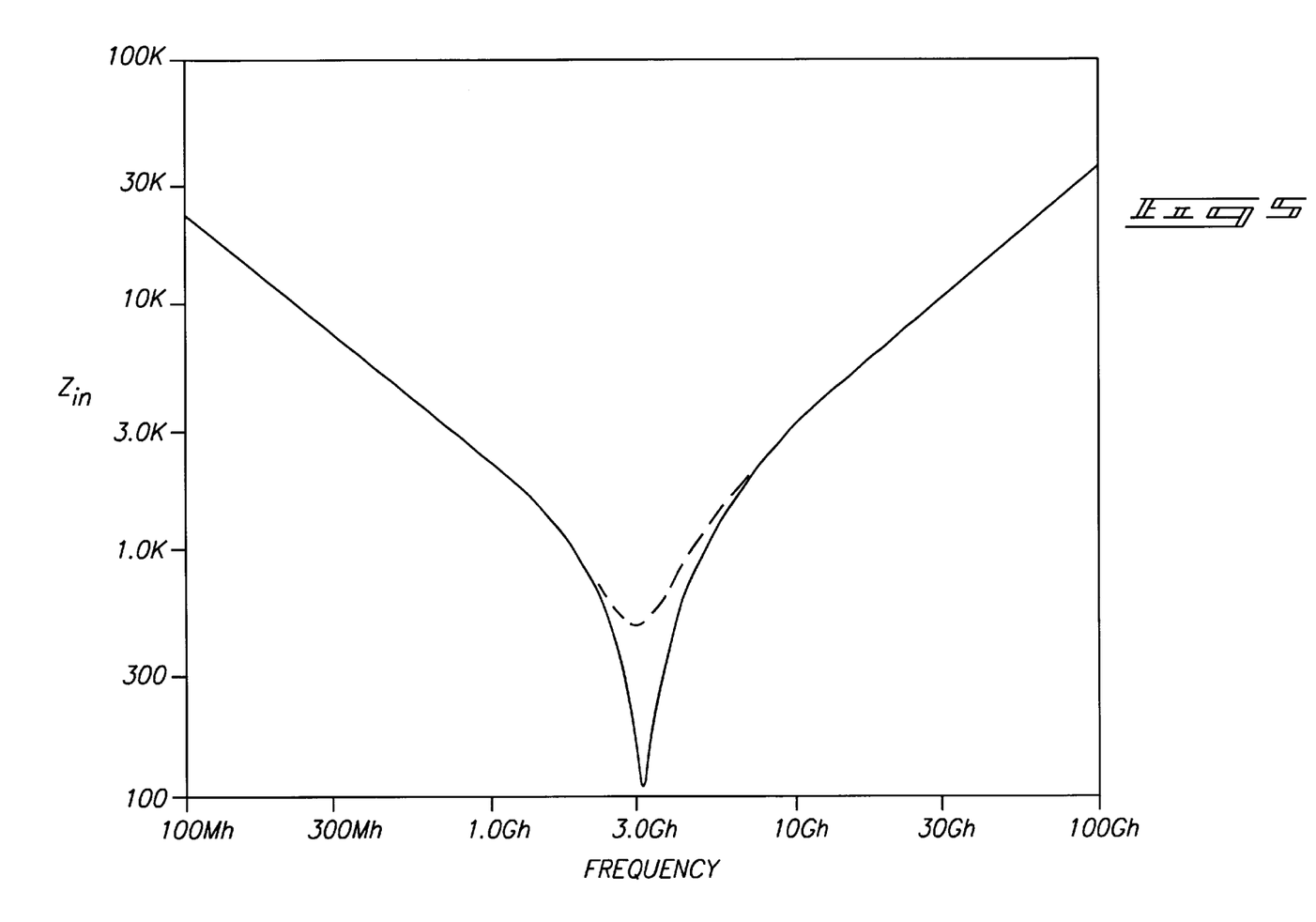
FIG. 5 is a graph which is useful in understanding the operation of one or more embodiments of the invention.

Another condition for stability and to avoid any oscillations or ringing in the circuit is to also make the real part of the impedance or resistance looking into the circuit positive by adding series resistance or by increasing the resistance of the coil $R_c$. For application as an oscillator, the negative real part of the input impedance, Z, can be utilized by not adding enough resistance to make it stable, but rather to allow it to oscillate. FIG. 5 illustrates the input impedance $Z_{in}$ looking of FIG. 1, of the circuit in series with the capacitor to make it resonant and with the additional added resistance, R.

There is an optimum choice for the resistance R. If R is too small, as shown in FIG. 5 by the dashed line, then the input impedance will have a broad minimum and not a sharp dip such as would be characterized by a high Q value. The magnitude of the oscillation will be very large, too large in fact, and the frequency of the oscillation will not be centered at or around 3 GHz due to the low value of Q. If the added resistance is too large, the sum of the negative real part of the impedance, Z, and the added resistance will be too small. This will result in a very high Q and very sharp dip in the input impedance in FIG. 5, but too little net negative impedance to allow oscillation.

Figure 6:
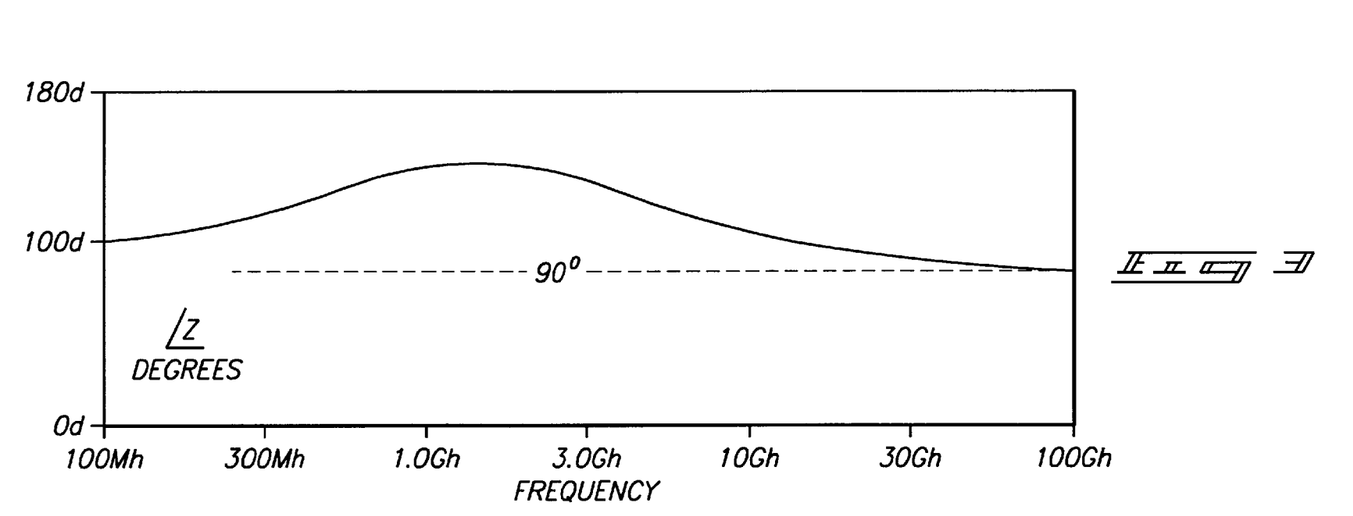
FIG. 6 is a graph which is useful in understanding the operation of one or more embodiments of the invention.

In this example, circuit simulations have been conducted and suggest choosing a value of R around 100 ohms. This can result in a moderate amplitude oscillation at a frequency around 3 GHz as shown in FIG. 6. Put another way, the effective inductance $L_{eff}$ in this resonant circuit has been increased from an actual value of 9 nH to 46 nH by the action of feedback in the transistor circuit. The circuit can now resonate at around 3 GHz with the addition of a 0.07 pF capacitor. This avoids the use of a large capacitor and/or inductor. Accordingly, such avoids the use of large areas on an integrated circuit wafer. Fabrication of the inductor is compatible with the CMOS integrated circuit technology and requires only two levels of metal. The 0.07 pF capacitor can be a voltage variable capacitor, or either a junction capacitance or a voltage variable gate capacitance of an FET to allow tuning of the VCO frequency.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A monolithic integrated circuit oscillator comprising:
   a semiconductive substrate;
   a first field effect transistor formed on the semiconductive substrate; and
   an oscillator circuit connected with the first field effect transistor and comprising an inductor which is supported by the semiconductive substrate, the inductor having an inductance value greater than or equal to about 4 nH, and a capacitor comprising a gate capacitance of a second field effect transistor operably connected with the inductor.

2. The monolithic integrated circuit oscillator of claim 1, wherein the inductor comprises a spiral-type inductor.

3. The monolithic integrated circuit oscillator of claim 1, wherein the inductor has an inductance value greater than or equal to about 9 nH.

4. The monolithic integrated circuit oscillator of claim 1, wherein the oscillator circuit comprises a second inductor connected with the field effect transistor and having an inductance value greater than or equal to about 4 nH.

5. The monolithic integrated circuit oscillator of claim 1, wherein the first field effect transistor comprises a gate, a drain, and a source, and wherein the inductor is connected with the gate, and wherein the oscillator circuit comprises a second inductor having an inductance value greater than or equal to about 4 nH, the second inductor being connected with the source of the first transistor.

6. The monolithic integrated circuit oscillator of claim 1, wherein the oscillator circuit comprises a capacitor operably connected with the inductor, and wherein the inductor comprises a spiral-type inductor.

7. The monolithic integrated circuit oscillator of claim 1, wherein the oscillator circuit comprises a capacitor operably connected with the inductor, and wherein the inductor has an inductance value greater than or equal to about 9 nH.

8. The monolithic integrated circuit oscillator of claim 1, wherein the oscillator circuit comprises a capacitor operably connected with the inductor, wherein the oscillator circuit comprises a second inductor connected with the first field effect transistor and having an inductance value greater than or equal to about 4 nH, and further wherein one of the inductors is a spiral-type inductor.

9. The monolithic integrated circuit oscillator of claim 1, wherein the oscillator circuit comprises a capacitor operably connected with the inductor, wherein the oscillator circuit comprises a second inductor connected with the field effect transistor and having an inductance value greater than or equal to about 4 nH, and further wherein both of the inductors are spiral-type inductors.

10. A complementary metal oxide semiconductor (CMOS) voltage-controlled oscillator comprising:
    a first metal oxide semiconductor field effect transistor (MOSFET) received by a silicon substrate and having a gate, a source, and a drain;

a first inductor received within an insulative material layer supported by the substrate, the first inductor being connected with the gate;

a second inductor received within the insulative material layer and connected with the source; and a capacitor comprising a gate capacitance of a second field effect transistor and operably connected with the first inductor, wherein at least one of the inductors has an inductance value greater than or equal to about 4 nH.

11. The CMOS voltage-controlled oscillator of claim 10, wherein one of the first and second inductors comprises a spiral-type inductor.

12. The CMOS voltage-controlled oscillator of claim 10, wherein both inductors comprise spiral-type inductors.

13. The CMOS voltage-controlled oscillator of claim 10, wherein the substrate comprises a bulk monocrystalline substrate.

14. The CMOS voltage-controlled oscillator of claim 10, wherein one of the inductors is received over the other of the inductors.

15. The CMOS voltage-controlled oscillator of claim 10, wherein the first and second inductors have inductance values which are greater than or equal to about 4 nH.

16. The CMOS voltage-controlled oscillator of claim 10, wherein the oscillator is configured to oscillate at a frequency around 3 GHz.

17. The CMOS voltage-controlled oscillator of claim 10, wherein the oscillator is monolithic.

18. An integrated circuit oscillator comprising:
a bulk monocrystalline silicon substrate;
a first field effect transistor formed on the substrate and comprising a gate, a source, and a drain;
a first spiral-type inductor received within an insulative layer over the substrate and operably connected with the gate;
a second spiral-type inductor received within the insulative layer and operably connected with the source; and
a capacitor comprising a gate capacitance of a second field effect transistor and operably connected with the first field effect transistor and having a value no greater than about 0.1 pF.

19. The integrated circuit oscillator of claim 18, wherein the oscillator is configured to oscillate at a frequency around 3 GHz.

20. The integrated circuit oscillator of claim 18, wherein the capacitor comprises a voltage-variable capacitor.

21. The integrated circuit oscillator of claim 18, wherein the oscillator is monolithic.

22. An integrated circuit oscillator comprising:
a bulk monocrystalline silicon substrate;
a first field effect transistor formed on the substrate and comprising a gate, a source, and a drain;
a first spiral-type inductor received within an insulative layer over the substrate and operably connected with the gate;
a second spiral-type inductor received within the insulative layer and operably connected with the source; and
a capacitor operably connected with the field effect transistor and having a value no greater than about 0.1 pF, wherein the capacitor comprises a junction capacitance of a second field effect transistor.

23. An integrated circuit oscillator comprising:
a silicon substrate;
a first metal oxide semiconductor field effect transistor (MOSFET) formed on the substrate;
an inductor assembly supported by the substrate and operably connected with the field effect transistor, the inductor assembly comprising no more than from between two to four conductive material levels over the substrate; and
a capacitor comprising a gate capacitance of a second field effect transistor and operably connected with the first field effect transistor and the inductor assembly and together therewith providing a circuit capable of resonating at frequencies greater than 1 GHz.

24. The integrated circuit oscillator of claim 23, wherein the inductor assembly comprises two inductors.

25. The integrated circuit oscillator of claim 23, wherein the inductor assembly comprises only two inductors.

26. The integrated circuit oscillator of claim 23, wherein the inductor assembly comprises two spiral-type inductors.

27. The integrated circuit oscillator of claim 23, wherein the oscillator is monolithic.

28. An oscillator-forming method comprising:
providing a silicon-containing substrate;
forming a first field effect transistor on the substrate, the first transistor having a gate, a source, and a drain;
forming a first inductor which is operably connected with the gate;
forming a second inductor which is operably coupled with the source; and
coupling a capacitor comprising a gate capacitance of a second field effect transistor with the first inductor sufficiently to form an oscillation circuit capable of oscillating at a frequency around 3 GHz, and having a quality factor Q greater than about 10.

29. The oscillator-forming method of claim 28, wherein the coupling of the capacitor comprises forming the capacitor over the substrate.

30. The oscillator-forming method of claim 28, wherein the forming of the first and second inductors comprises forming one of the inductors to be a spiral-type inductor.

31. The oscillator-forming method of claim 28, wherein the forming of the first and second inductors comprises forming both of the inductors to be spiral-type inductors.

32. An oscillation method comprising:
providing a bulk monocrystalline silicon substrate having formed thereon circuitry capable of oscillating at a frequency of around 3 GHz, the circuitry comprising a first field effect transistor having a gate and a source, a pair of inductors operably connected with the gate and the source, respectively, of the field effect transistor, and a capacitor comprising a gate capacitance of a second field effect transistor and operably coupled with the inductors; and
oscillating the circuitry at a frequency of around 3 GHz.

33. The oscillation method of claim 32, wherein said providing comprises forming at least a portion of the circuitry over the substrate.

34. The oscillation method of claim 32, wherein said providing comprises forming one of the inductors as a spiral-type inductor.

35. The oscillation method of claim 32, wherein said providing comprises forming both of the inductors as spiral-type inductors.

36. The oscillation method of claim 32, wherein said providing comprises providing inductors having inductance values greater than or equal to about 4 nH, and providing a capacitor having a capacitance value of less than or equal to about 0.1 pF.

37. The oscillation method of claim 32, wherein said providing comprises forming inductors having inductance values greater than or equal to about 4 nH, and forming a capacitor having a capacitance value of less than or equal to about 0.1 pF.

38. The oscillation method of claim 32, wherein said providing comprises forming the first and second field effect transistors as MOSFETs.

39. The oscillation method of claim 32, wherein at least one of the inductors comprises a spiral-type inductor.

40. The oscillation method of claim 32, wherein both of the inductors comprise spiral-type inductors.

41. A method of forming a monolithic integrated circuit oscillator comprising:

provided a semiconductive substrate;

forming a first field effect transistor on the semiconductive substrate;

coupling an inductor to the first field effect transistor, the inductor being supported by the semiconductive substrate and having an inductance value greater than or equal to about 4 nH;

forming a capacitor on the substrate, the capacitor comprising a gate capacitance of a second field effect transistor operably connected with the inductor.

42. The method of claim 41, wherein coupling an inductor comprises coupling a spiral-type inductor to the first field effect transistor.

43. The method of claim 41, further comprising coupling a second inductor to the first field effect transistor, the second inductor having an inductance value greater than or equal to about 4 nH.

44. The method of claim 41, wherein coupling an inductor comprises coupling the inductor to a gate of the first field effect transistor, and further comprising coupling a second inductor having an inductance value greater than or equal to about 4 nH to a source of the first transistor.

* * * * *

UNITED STATES PATENT AND TRADEMARK OFFICE
CERTIFICATE OF CORRECTION

PATENT NO. : 6,249,191 B1
DATED : June 19, 2001
INVENTOR(S) : Leonard Forbes

It is certified that error appears in the above-identified patent and that said Letters Patent is hereby corrected as shown below:

Column 7,
Line 21, delete "$L_{eff} = M_1L_1$," and insert -- $L_{eff} = M_1*L_1$, --.
Line 42, delete "of FIG. 1," and insert --into the circuit of FIG. 1, --.

Signed and Sealed this

Fifteenth Day of January, 2002

*Attest:*

JAMES E. ROGAN
*Attesting Officer*     *Director of the United States Patent and Trademark Office*